(12) United States Patent
Ju (10) Patent No.: US 7,057,295 B2
(45) Date of Patent: Jun. 6, 2006

(54) IC MODULE ASSEMBLY

(76) Inventor: Ted Ju, P.O. Box 26-757, Taipei 106 (TW)

( * ) Notice: Subject to any disclaimer, the term of this patent is extended or adjusted under 35 U.S.C. 154(b) by 17 days.

(21) Appl. No.: 10/831,697

(22) Filed: Apr. 22, 2004

(65) Prior Publication Data

US 2005/0236719 A1    Oct. 27, 2005

(51) Int. Cl.
*H01L 23/48* (2006.01)
*H01L 23/52* (2006.01)
*H01L 29/40* (2006.01)

(52) U.S. Cl. .................. 257/784; 257/718; 257/777
(58) Field of Classification Search ............... 257/784, 257/778, 727, 785; 361/400, 401, 430, 774; 438/116
See application file for complete search history.

(56) References Cited

U.S. PATENT DOCUMENTS

| 4,553,192 | A | * | 11/1985 | Babuka et al. | 361/743 |
| 5,761,036 | A | * | 6/1998 | Hopfer et al. | 361/704 |
| 5,786,635 | A | * | 7/1998 | Alcoe et al. | 257/718 |
| 6,750,551 | B1 | * | 6/2004 | Frutschy et al. | 257/785 |
| 6,885,106 | B1 | * | 4/2005 | Damberg et al. | 257/777 |
| 6,913,468 | B1 | * | 7/2005 | Dozier et al. | 439/66 |

* cited by examiner

*Primary Examiner*—Zandra V. Smith
*Assistant Examiner*—Tsz K. Chiu
(74) *Attorney, Agent, or Firm*—Rosenberg, Klein & Lee (57) ABSTRACT

An IC module assembly includes an IC module including a plurality of pads disposed on a bottom thereof, a plurality of resilient members respectively soldering to the pads, and a PCB having a plurality of conductive patterns arranged on a top thereof and corresponding to the resilient members respectively, whereby the IC module electrically connects the PCB by the resilient members abutting against the conductive patterns of the PCB.

11 Claims, 9 Drawing Sheets

IC MODULE ASSEMBLY

BACKGROUND OF THE INVENTION

1. Field of the Invention

The present invention relates to an IC module assembly, and particularly relates to an IC module assembly adopted for an IC module having a plurality of pads disposed thereon.

2. Background of the Invention

Figure 1:
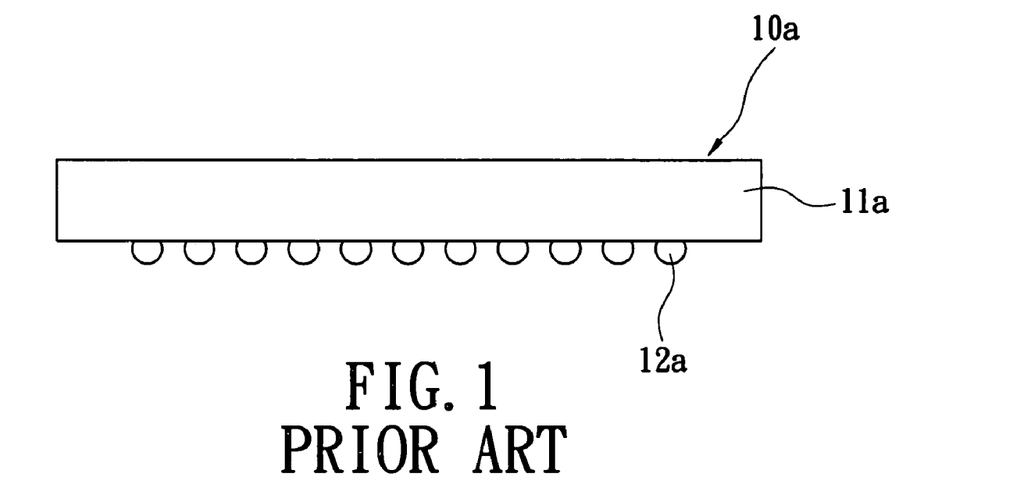
FIG. 1 is a perspective view according to a first conventional IC module.
Figure 2:
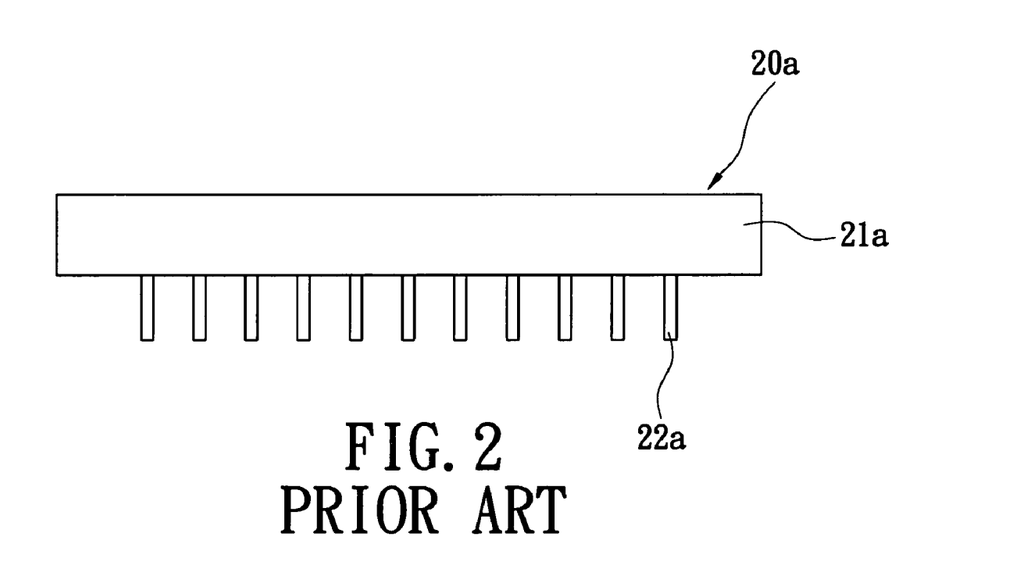
FIG. 2 is a perspective view according to a second conventional IC module
Figure 3:
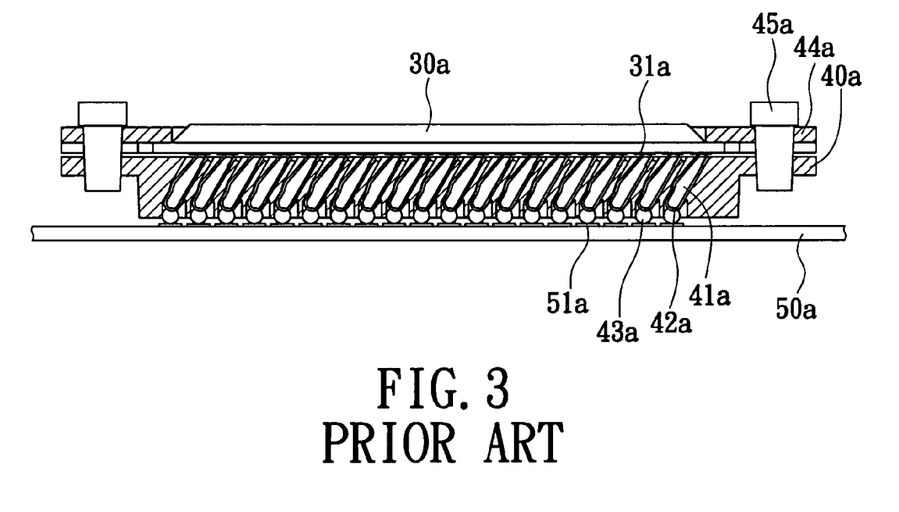
FIG. 3 is a perspective view according to a third conventional IC module.

FIG. 1 shows a first connectional IC module 10a having a housing 11a, a plurality of pins (not shown) received in the housing 11a, and a plurality of solder balls 12a arranged corresponding to the pins and exposing out of the housing 11a. The first conventional IC module 10a is so-called Ball Grid Array (BGA) IC package, and applied to a first connectional IC socket (not shown) that has a plurality of patterns relating to the solder balls 12a. With respect to FIG. 2, a second conational IC module 20a having a housing 21a, and a plurality of pins 22a extending from the housing 21a. The pins 22a can mate with an IC socket (not shown) or solder into a through-hole printed circuit board (PCB). However, as the tendency for increasing the quantity of the pins needs to meet, the pin type IC package meet requirements no more and a pad type IC package is consequently used. Furthermore, the PCB adopted for the pad type IC package can accordingly has a multiple functional layout arranged thereof. Illustrated in FIG. 3, a third conventional IC module 30a received in an IC socket 40a, which includes a plurality of passageways 41a formed therein and a plurality of contacts 42a receiving in the passageways 41a respectively, and a plurality of solder balls 43a arranged bottom sides of the contacts 42a respectively. The IC module 30a electrically connects the PCB 50a via both the bottom sides of the contacts 42a soldering to conductive patterns 51a and top sides of the contacts 42a abutting against the pads 31a of the IC module 30a. The IC module 30a further loads a retaining plate 44a pressed therefrom, the retaining plate 44a connect to the IC socket 40a tightly via a screw 45a. The third IC module 30a must equip with the IC socket 40a to electrically connect the PCB 50a, and manufacturing steps thereof will not decreases and costs thereof cannot be cut down.

Hence, an improvement over the prior art is required to overcome the disadvantages thereof.

SUMMARY OF INVENTION

The primary object of the invention is therefore to specify an IC module assembly that can adopt for an IC module having a plurality of the pads.

The secondary object of the invention is therefore to specify an IC module assembly that can omit an IC socket to cut down costs and manufacturing steps.

The third object of the invention is therefore to specify an IC module assembly that provides easy soldering steps for connection between the IC module and resilient members, the manufacturing costs is further saved.

According to the invention, the object is achieved by an IC module assembly including an IC module having a plurality of pads disposed on a bottom thereof, a plurality of resilient members respectively soldering to the pads, and a PCB having a plurality of conductive patterns arranged on a top thereof and corresponding to the resilient members respectively, whereby the IC module electrically connects the PCB by the resilient members abutting against the conductive patterns of the PCB.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings where:

FIG. 9 is a perspective view of another embodiment of an orientation post according to the IC module assembly of the present invention; and.

DETAILED DESCRIPTION OF THE EMBODIMENTS

Figure 4:
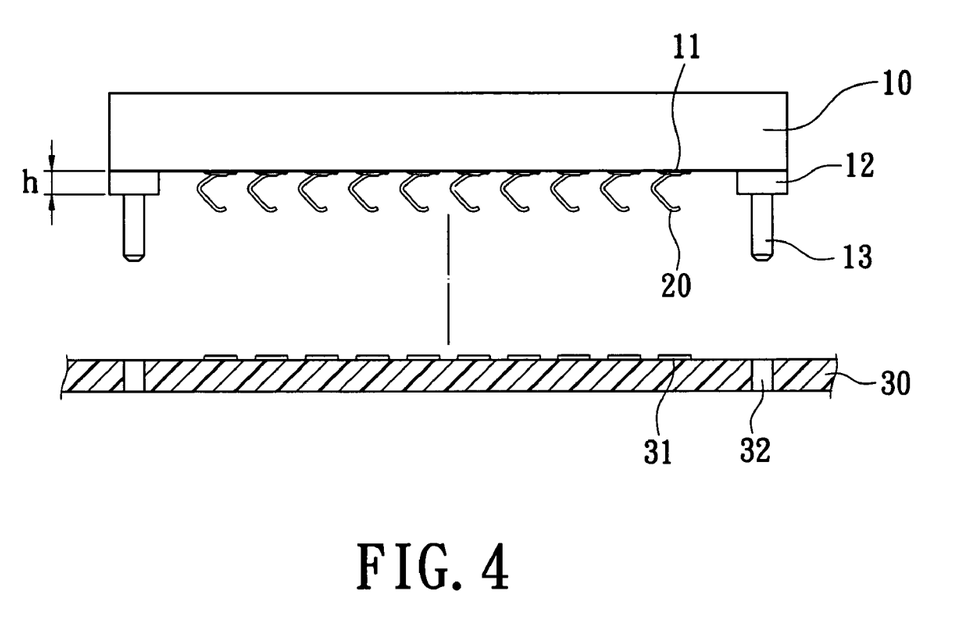
FIG. 4 is a perspective view according to an IC module assembly of the present invention.
Figure 5:
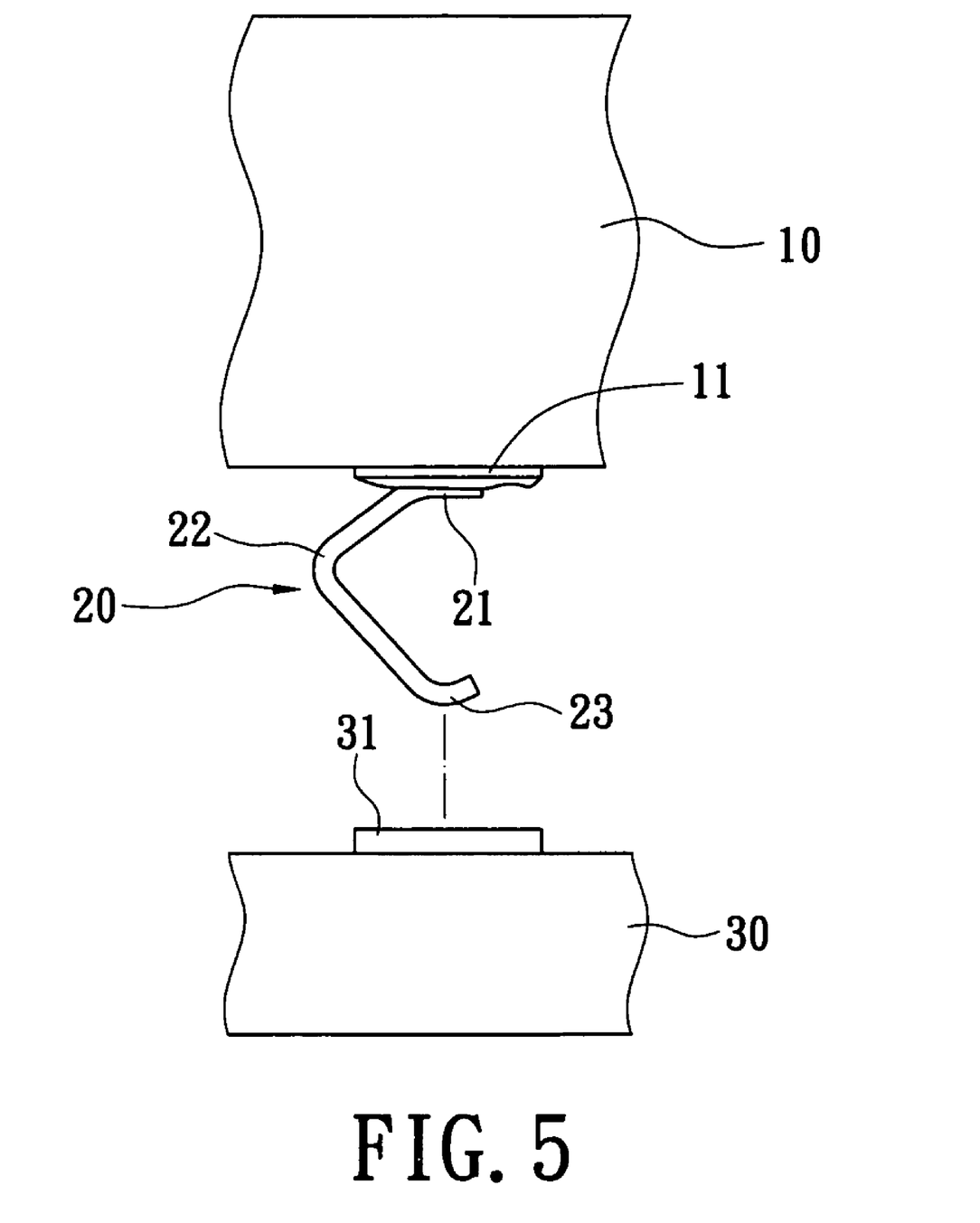
FIG. 5 is an enlarged view of according to the IC module assembly of the present invention.
Figure 6:
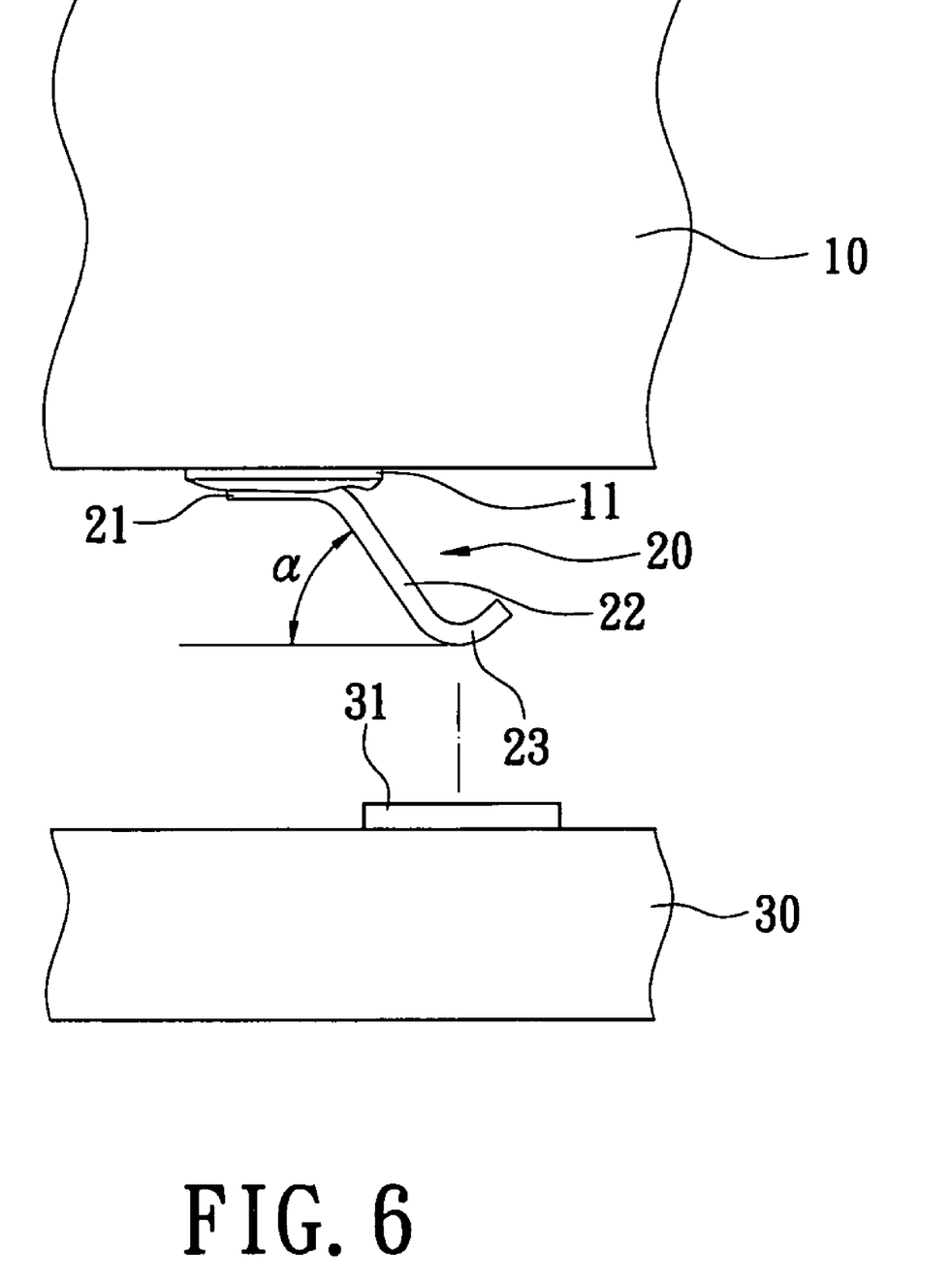
FIG. 6 is an enlarged view of another embodiment according to resilient members of the present invention.
Figure 7:
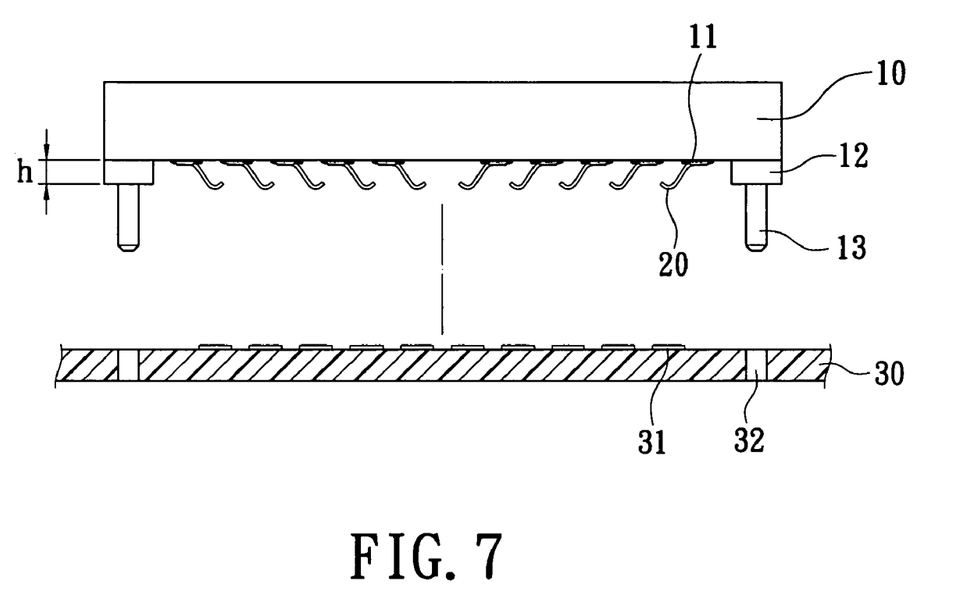
FIG. 7 is an enlarged view with a various predetermined angle according to resilient members of the present invention.
Figure 8:
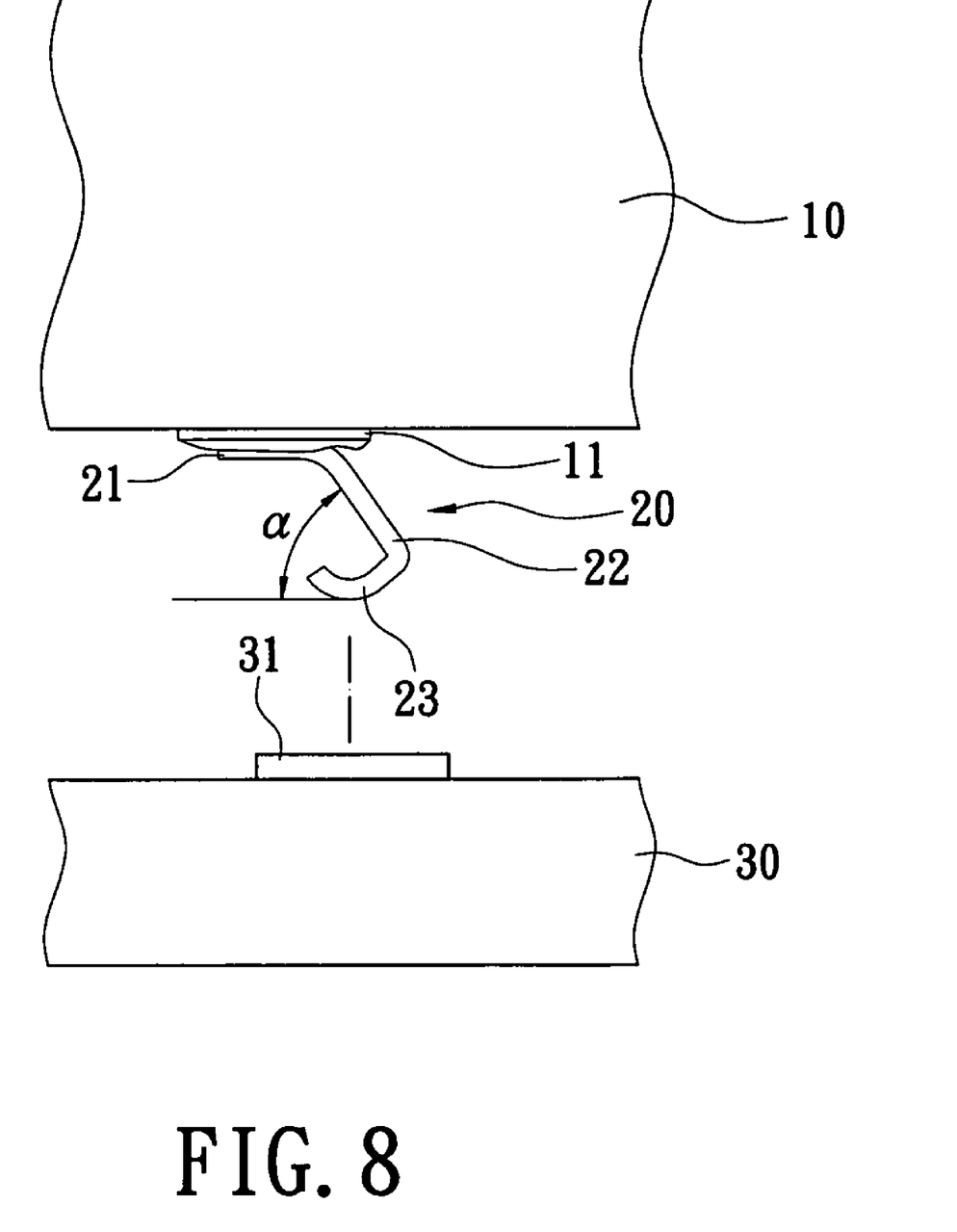
FIG. 8 is an enlarged view according to resilient members of the present invention, while the contact portion and the soldering portion dispose at a lateral side of the middle portion simultaneously.
Figure 9:
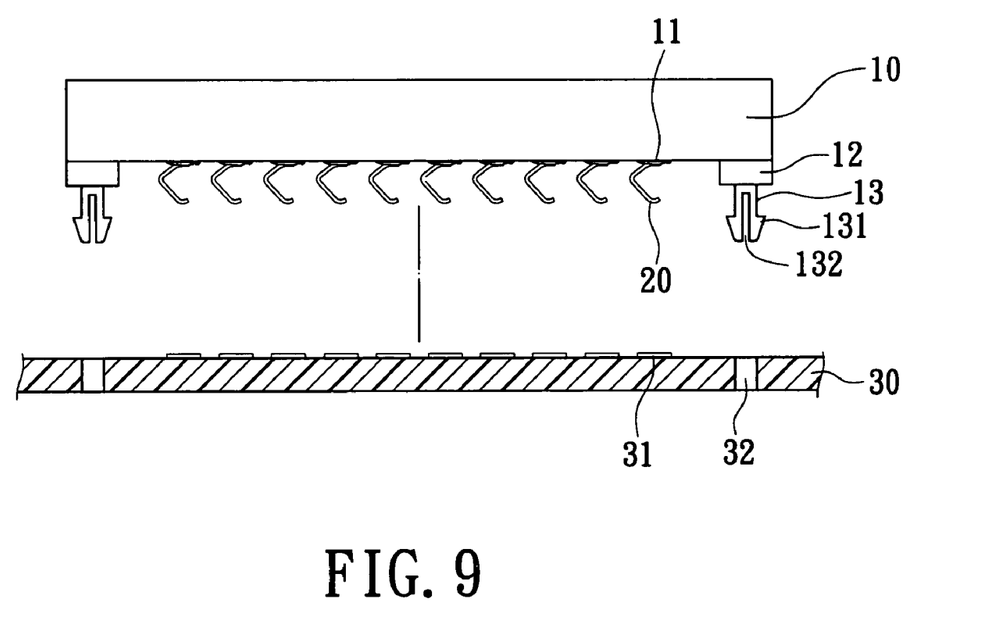
Figure 10:
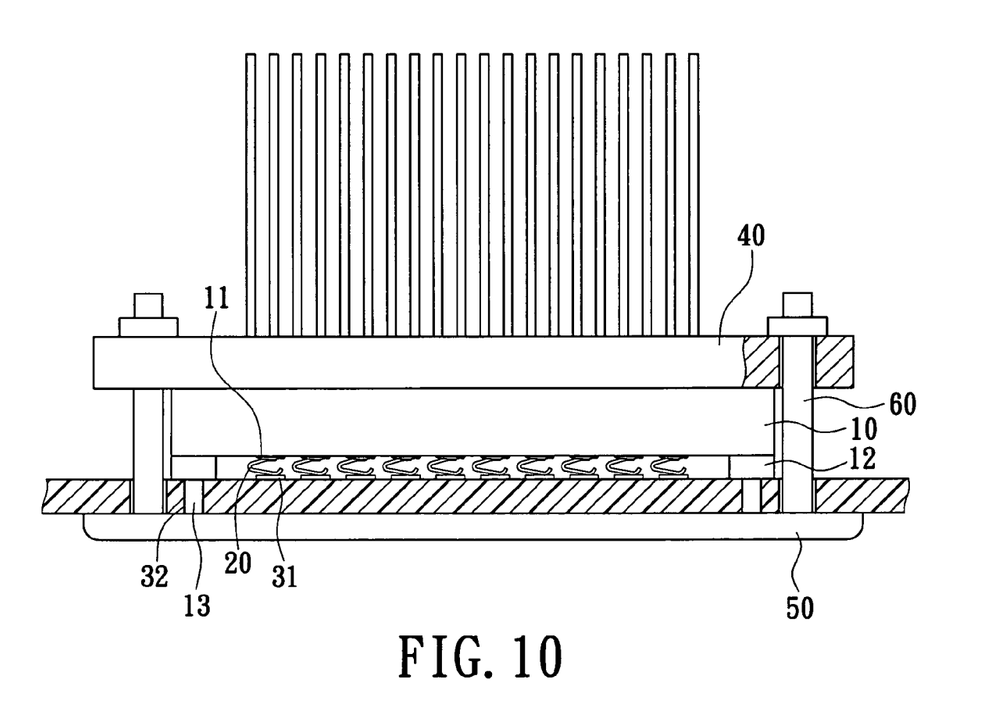
FIG. 10 is a perspective view of another embodiment according to the IC module assembly of the present invention.

With respect to FIG. 4, an IC module assembly includes an IC module 10 having a plurality of pads 11 disposed on a bottom thereof, a plurality of resilient members 20 respectively soldering to the pads 11, and a PCB 30 having a plurality of conductive patterns 31 arranged on a top thereof and corresponding to the resilient members 20 respectively, whereby the IC module 10 electrically connects the PCB 30 by the resilient members 20 abutting against the conductive patterns 31 of the PCB 30 and soldering to the pads 11 of the IC module 10. An IC socket receiving the IC module assemble can be omitted to cut down costs and manufacturing steps accordingly, and easy soldering steps for connection between the IC module 10 and resilient members 20 can be provided thereby. The IC module 10 includes a limit portion 12 extending from the bottom thereof, and an orientation post 13 disposed on the bottom thereof. The limit portion 12 has a predetermined height "h" to avoid over compressing the resilient members 20, and the orientation post 13 can extend downwardly from the limit portion 12. The PCB 30 includes an orientation hole 32 formed thereon and relating to receive the orientation post 13 therein. With respect to FIG. 9, the orientation post 13 has two hooks 131 arranged respectively on two lateral sides of a distal end thereof, and a slot 132 formed on the distal end and between the two hooks 131, thus the orientation post 13 is capable of resiliently clamping in the orientation hole 32. Referring to FIG. 5, an enlarged view each of the resilient members 20 that each has a soldering portion 21 soldered to each of the pads 11 of the IC module 10 and being sheet-liked, a contact portion 23 abutting against each of the conductive patterns 31 of the PCB 30, and a middle portion 22 connecting the soldering portion 21 and the contact portion 23. The contact portion 23 is curved, spiral or the like. The middle portion 22 is in a V shape. Illustrated in FIG. 6, the middle portion 22 can incline with a predetermined angle α that can be identical in this embodiment. Alternatively, in FIG. 7, the predetermined angle α of the middle portion 22 can vary to comply with each of different locations of the resilient members 20, particularly the predetermined angle α can be complementary alternatively for one another, so as to prevent the IC module 10 from shifting after assembling. Wherein the contact portion 23 and the soldering portion 21 dispose at a lateral side (in FIG. 8) or at two opposing lateral sides of the middle portion 22 simultaneously (in FIG. 6). Referring to FIG. 10, the IC module assembly further includes a heat sink 40 disposed on a top of the IC module 10 and tightly contacting with the IC module 10, whereby the heat sink 40 secured to the PCB 30 presses and contain the IC module 10 therebetween. According to this embodiment, the IC module assembly can include a back plate 50 arranged under the PCB 30 and secure member 60 connecting the heat sink 40 and the back plate 50, wherein the IC module 10 is sandwiched therebetween, and the secure member 60 is capable of preventing the PCB 30 from warping and twisting. As people know, the PCB 30 perhaps be bent or twisted owing to the heat sink 40 oppressing the IC module 10 to the PCB 30 excessively. The secure member 60 can provide a mechanical equilibrium to balance between the PCB 30, the heat sink 40, the back plate 50, and the IC module 10. The secure member 60 is a screw. The heat sink 40 presses the IC module 30 to abut against the conductive patterns 31 via the resilient members 20, so that the IC module 10 electrically and firmly connects the PCB 30 thereby. In conclusion, this is a great advancement during the intense competition in the art.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An integrated circuit (IC) module assembly comprising:
   an IC module including a plurality of pads disposed on a bottom thereof, at least one limit portion having a predetermined height extending from the bottom of the IC module, and at least one orientation post integrally formed with the limit portion and extending from a bottom of the limit portion;
   a plurality of resilient members each having a portion thereof respectively soldered to the plurality of pads; and
   a printed circuit board (PCB) having a plurality of conductive patterns arranged on a top thereof and respectively corresponding to the plurality of resilient members, and at least one orientation hole formed thereon and aligned with the at least one orientation post to receive the orientation post therein;
   whereby the IC module is prevented from lateral displacement by the orientation post being disposed in the orientation hole and compression of the plurality of resilient members being limited to the predetermined height of the limit portion, the IC module being electrically connected to the PCB by the resilient members respectively abutting against the conductive patterns of the PCB.

2. The IC module assembly as claimed in claim 1, wherein the resilient members each has a soldering portion soldered to each of the pads of the IC module having a planar contour, a contact portion abutting against each of the conductive patterns of the PCB, and a middle portion connecting the soldering portion and the contact portion.

3. The IC module assembly as claimed in claim 2, wherein the middle portion inclines with a predetermined angle.

4. The IC module assembly as claimed in claim 3, wherein the predetermined angle of the middle portion varies to comply with each of different locations of the resilient members, so as to prevent the IC module from shifting after assembling.

5. The IC module assembly as claimed in claim 2, wherein the middle portion is in a V shape.

6. The IC module assembly as claimed in claim 2, wherein the contact portion and the soldering portion dispose at a lateral side of the middle portion simultaneously.

7. The IC module assembly as claimed in claim 2, wherein the contact portion and the soldering portion dispose at two opposing lateral sides of the middle portion simultaneously.

8. The IC module assembly as claimed in claim 1, wherein the limit portion has a predetermined height to avoid over compressing the resilient members.

9. An integrated circuit (IC) module assembly comprising:
   an IC module including a plurality of pads disposed on a bottom thereof, at least one limit portion having a predetermined height extending from the bottom of the IC module, and at least one orientation post integrally formed with the limit portion and extending from a bottom of the limit portion, the orientation post having two resilient hooks arranged respectively on two lateral sides of a distal end thereof, with an axially extended slot formed therebetween to allow inward displacement of the two hooks;
   a plurality of resilient members each having a portion thereof respectively soldered to the plurality of pads; and
   a printed circuit board (PCB) having a plurality of conductive patterns arranged on a top thereof and respectively corresponding to the plurality of resilient members, and at least one orientation hole formed therein and aligned with the at least one orientation post to receive the orientation post therein, the two hooks of the orientation post resiliently clampingly engaging the PCB through the orientation hole responsive to being passed therethrough;
   whereby the IC module is prevented from displacement by the orientation post being disposed in the orientation hole and the plurality of resilient members being held in a compressed state by engagement of the hooks with the PCB, the compression being limited to the predetermined height of the limit portion, the IC module being electrically connected to the PCB by the resilient members respectively abutting against the conductive patterns of the PCB.

10. The IC module assembly as claimed in claim 1, further including a heat sink disposed on a top of the IC module and tightly contacting with the IC module, whereby the heat sink secured to the PCB presses and contain the IC module therebetween.

11. The IC module assembly as claimed in claim 10, further including a back plate arranged under the PCB, and a secure member connecting the heat sink and the back plate, wherein the IC module is sandwiched therebetween, and the secure member is capable of preventing the PCB from warping and twisting.

* * * * *